United States Patent [19]

Israelsen et al.

[11] Patent Number: 5,799,110
[45] Date of Patent: Aug. 25, 1998

[54] HIERARCHICAL ADAPTIVE MULTISTAGE VECTOR QUANTIZATION

[75] Inventors: Paul D. Israelsen, North Logan; Chien-Min Huang, Logan, both of Utah

[73] Assignee: Utah State University Foundation, North Logan, Utah

[21] Appl. No.: 555,434

[22] Filed: Nov. 9, 1995

[51] Int. Cl.$^6$ .................................................. G06K 9/36
[52] U.S. Cl. ........................ 382/253; 382/240; 382/1
[58] Field of Search .......................... 382/253, 251, 382/270, 240; 348/405, 414, 417, 418, 422

[56] References Cited

U.S. PATENT DOCUMENTS

| | | | |
|---|---|---|---|
| 4,958,225 | 9/1990 | Bi et al. | 358/133 |
| 5,031,037 | 7/1991 | Israelsen | 358/133 |
| 5,124,791 | 6/1992 | Israelsen et al. | 358/136 |
| 5,172,228 | 12/1992 | Israelsen | 358/133 |
| 5,194,864 | 3/1993 | Nakano | 348/422 |
| 5,194,950 | 3/1993 | Murakami et al. | 358/133 |
| 5,204,899 | 4/1993 | Israelsen et al. | 380/14 |
| 5,231,485 | 7/1993 | Israelsen et al. | 348/405 |
| 5,235,418 | 8/1993 | Lucas | 358/133 |
| 5,247,348 | 9/1993 | Israelsen et al. | 348/403 |
| 5,255,346 | 10/1993 | Wu et al. | 348/147 |
| 5,272,529 | 12/1993 | Frederiksen | 348/422 |
| 5,371,544 | 12/1994 | Jacquin et al. | 348/398 |
| 5,398,069 | 3/1995 | Huang et al. | 348/418 |
| 5,432,554 | 7/1995 | Nickerson et al. | 348/391 |
| 5,440,346 | 8/1995 | Alattar et al. | 348/420 |
| 5,450,132 | 9/1995 | Harris et al. | 348/418 |
| 5,457,495 | 10/1995 | Hartung | 348/414 |
| 5,459,518 | 10/1995 | Wickstrom | 348/420 |
| 5,487,086 | 1/1996 | Bhaskar | 348/405 |
| 5,488,568 | 1/1996 | Keith et al. | 348/397 |
| 5,491,513 | 2/1996 | Wickstrom et al. | 348/409 |
| 5,610,657 | 3/1997 | Zhang | 348/402 |

OTHER PUBLICATIONS

Gersho et al., Vector Quantization and Signal Compression, 1991, pp. 435–439, pp. 451–455.
Cosman et al., "Using Vector Quantization for Image Processing," vol. 36, No. 9, pp. 1445–1453, (Sep. 1988).
Venbrux, J., et al., "A VLSI Chip Set for High–Speed Lossless Data Compression," IEEE Transactions on Circuits and Systems for Video Technology, vol. 2, No. 4, Dec. 1992, pp. 381–391.
Wallace, G.K., "The JPEG Still Picture Compression Standard," IEEE Transactions on Consumer Electronics, vol. 38, No. 1, Feb. 1992, pp. xviii–xxxiv.

Primary Examiner—Yon J. Couso
Attorney, Agent, or Firm—Trask, Britt & Rossa

[57] ABSTRACT

An N-stage vector quantizer in which increasingly smaller portions of a vector are compared to a threshold until the quantization error is less than the threshold. The threshold may be adaptive to insure a constant bit rate. The first stage performs VQ and inverse VQ on an input vector. The difference between the inverse VQ and the input vector is determined to create a first stage residual error. If the first stage residual error is less than a threshold, no further stages of the multistage vector quantizer are used and the input vector or first stage residual is passed on to the output stage. However, if the first stage residual error is not less than the threshold, the residual error is passed to stage two of the multistage vector quantizer where VQ and inverse VQ are performed on the first stage residual error. The process is continued until the residual is less than the threshold. If the Nth stage is reached without the residual being less than the threshold, the process is repeated on a smaller portion of the original input vector. For example, if the original input vector were a 16×16 vector, the smaller section could be a 16×8 vector.

6 Claims, 8 Drawing Sheets

HIERARCHICAL ADAPTIVE MULTISTAGE VECTOR QUANTIZATION

BACKGROUND OF THE INVENTION

1. Field of the Invention

The present invention relates to a multistage vector quantizer in which increasingly smaller portions of a vector are compared to a threshold until the quantization error is less than the threshold.

2. State of the Art

Enormous numbers of bits are used to represent images in electronic form. Examples of such images are those used in video telephone systems and magnetic resonance imaging. Transmission of such electronic images over data lines, such as telephone lines, can take a significant amount of time. Further, storage of such data may take an enormous amount of memory.

Vector quantization (VQ) (a form of encoding) has been developed to reduce the number of data bits needed to represent an image. With a reduced number of data bits, the time to transmit the bits and the memory needed to store the data bits is also reduced. VQ deals with a block of samples (called a vector) at once, and as a result, VQ has some performance advantages as compared with scalar quantization. VQ can be viewed as pattern matching, where input patterns or vectors are approximated by one of many stored patterns in a codebook. The resulting quantization error from such an approximation depends upon how well the stored patterns, referred to as codevectors, represent the input vectors. Consequently, codebook generation may be greatly improved by prior knowledge of the information source and is important to the performance of VQ.

Consider an image that is divided into numerous small areas called pixels (for picture element). Pixels are sufficiently small that the intensity of the image is approximately constant across the pixel area. For example, a black and white image of a house might be divided into a grid of 600 rows and 600 pixels per row. Each pixel would be like a small dot in the image. A block or group of pixels in the same region would form a vector which can be thought of as a small subimage. For example, a 6×6 square block of pixels forms a 36 element vector, which may be a portion of a shadow or part of the roof line against a light background.

Mean-removed VQ (WRVQ) is a special case of product codes. Product codes refer to a family of vector quantization methods in which one large codebook is replaced by more than one smaller codebook. As a result, the vector space represented by the overall quantizer is given as the Cartesian product of smaller vector spaces, and hence the name product codes. In MRVQ, the sample mean of each input vector is computed and then subtracted from every vector component. The resulting mean removed, or residual, vector is then vector quantized. The utility of MRVQ is that the residual vectors can be adequately represented with many fewer codevectors as compared to the original image vectors. The mean of each vector is also coded and included along with each codevector index. Since the mean is a scalar quantity, it is scalar quantized. As a result, the mean includes all of the possible quantization levels of the scalar quantizer. MRVQ can provide a significant reduction in the overall complexity of a VQ system as compared to direct VQ.

SUMMARY OF THE INVENTION

The first stage of an N-stage multistage vector quantizer performs VQ and inverse VQ on an input vector. The difference between the inverse VQ and the input vector is determined to create a first stage residual error. If the first stage residual error is less than a threshold, no further stages of the multistage vector quantizer are used. At that point, either the input vector or first stage residual is passed on to the output stage.

However, if the first stage residual error is not less than the threshold, the residual error is passed to stage two of the multistage vector quantizer where VQ and inverse VQ are performed on the first stage residual error. The difference between the inverse VQ of the second stage and the first stage residual is determined to produce a second stage residual error. If the second stage residual error is less than the threshold, no further stages of the multistage vector quantizer are used. At that point, either the second or third stage residual error is passed on to the output stage.

The process is continued until the residual error of a stage is less than the threshold. In a preferred embodiment, N=6 (ie., there are six stages). If the residual error of the Nth stage is not less than the threshold, the process is repeated on a portion of the input vector. For example, if the original input vector were a 16×16 vector, the smaller section could be a 16×8 vector. The process may be repeated with progressively smaller vectors such as, for example, 8×8, 8×4, 4×4, 4×2, and 2×2 vectors.

The threshold may be adaptive to insure a constant bit rate. The adaptiveness extends both as the stages progress on increasingly small residuals and as the vector sizes grow smaller.

The error compared with the threshold may be the L1 error.

The input vector may have passed through a mean removal stage prior to entering the first stage of the multistage vector quantizer. In that case, the residual vector having passed through the mean removal stage may be compared to the threshold prior to entering the first stage of the multistage vector quantizer. If the residual vector is less than the threshold, there is no need to continue with the other stages.

Various other aspects of the invention are described below.

The claims as originally filed or later added define the scope of the invention.

DETAILED DESCRIPTION OF PREFERRED EMBODIMENTS

A. Camera and Initial Processing

The present invention may be used in various image systems including video telephone systems, surveillance cameras, CD ROM, ultrasound systems, etc. FIGS. 1, 2, and 4–7 are block diagram representations of a signal creation and encoder portion of a video telephone signal system 10. FIG. 8 is a block diagram representation of a remote decoder system of video telephone signal system 10.

Of course, the invention may be implemented in other video telephone systems having different structures. The function or details of some Blocks in the block diagrams described herein may change due to availability of parts, economic factors, or other reasons. (The term "Block" in block diagram should not be confused with "block" as a group of data, such as a 16×16 block of 256 pixels. To help distinguish between the two, a Block in a block diagram is capitalized and a block of data is not capitalized.) The term circuitry may include circuitry that operates with or without software or firmware. For example, depending on the context, circuitry could include one or more microprocessors. In the case in which one or more microprocessors are used to perform the functions of one or more blocks, the block diagrams represent a flow diagram.

Except in some situations (such as a memory), the Blocks of the block diagram may be implemented in hardware (including electronic circuitry), software, or firmware, or a combination of them. Accordingly, the term "Block" is not limited to any one of them. Speed and expense are factors in choosing how to implement a Block. Various well known techniques for the specific construction of the Blocks will be apparent to those skilled in the art.

In the case of Blocks that are implemented in hardware, it may make sense to have the hardware perform its function, and then later utilize or not utilize the function, depending on the outcome of another Block. By contrast, in the case where Blocks are implemented in software, it may make sense to not have a function performed unless it is needed.

Use of the term "a preferred embodiment" herein does not mean that other embodiments would not be acceptable. Indeed, the invention could be implemented in a variety of ways that will be apparent to those of skill in the art upon reading the present specification.

A. Camera and Initial Processing

Figure 1:
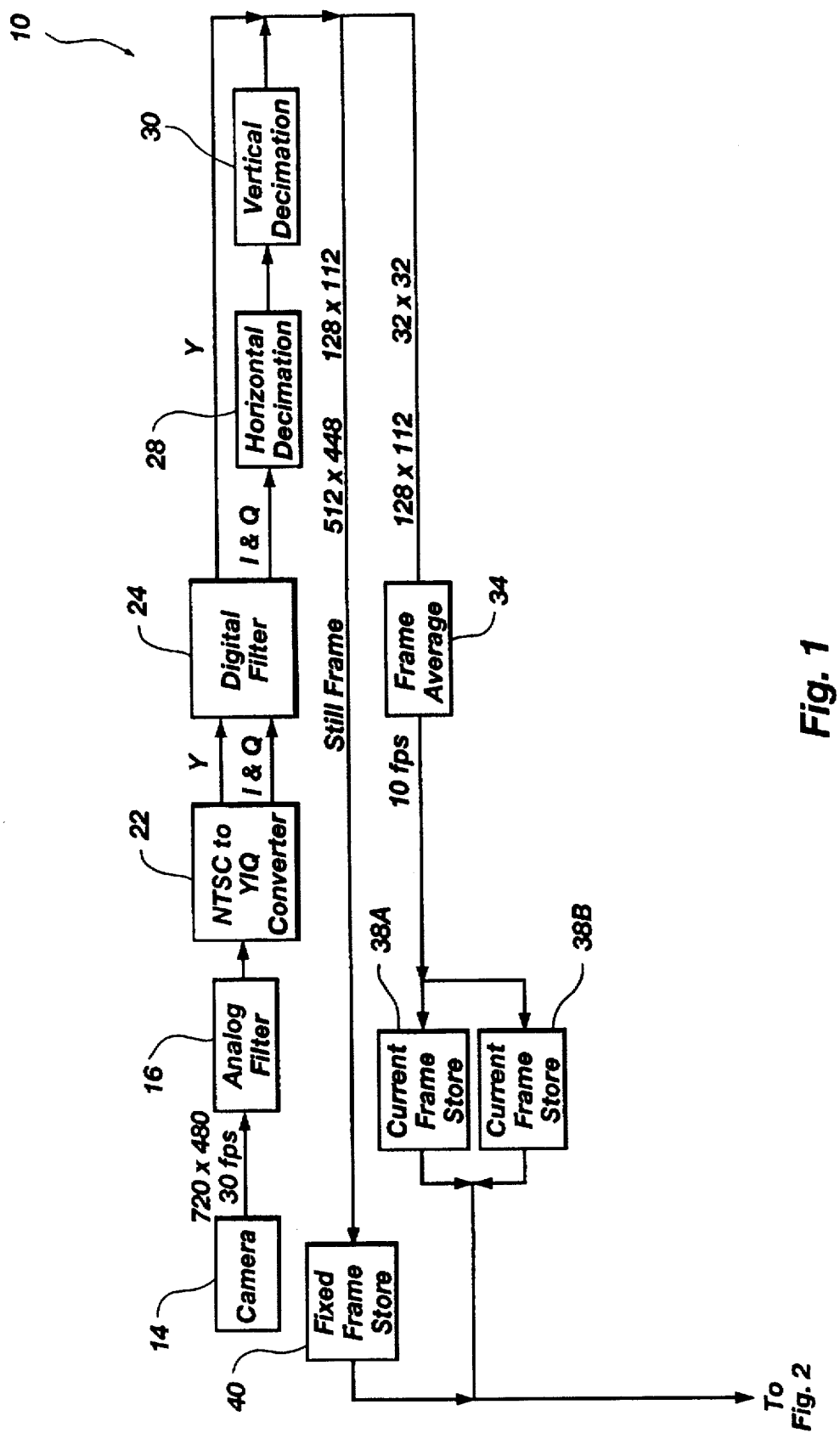
FIG. 1 is a block diagram representation of a video camera and initial processing blocks for preferred embodiments of a video telephone system.

Referring to FIG. 1, a camera 14 produces video images that are processed by Analog Filter Block 16, NTSC to YIQ Converter Block 22, a Digital Filter Block 24, Horizontal Decimation Block 28 and Vertical Decimation Block 30.

Camera 14 may be any of a variety of cameras, with cost and availability being considerations. In a preferred embodiment, camera 14 is capable of resolving 512 pixels horizontally and at least 480 lines vertically. A progressive scan camera may be the easiest to deal with from a design standpoint, but a camera that supplies interlaced video may be preferred. As shown in FIG. 1, for purposes of example, camera 14 produces 30 frames per second (fps) with 720 horizontal pixels and 480 lines vertically.

In a preferred embodiment, analog filter 16 eliminates aliasing (such as when the video is digitized at 512 samples in the active part of the horizontal line).

NTSC to YIQ Converter Block 22 transforms the red, green, and blue components into an alternate color space for compression. Transformation may be to YIQ, YUV, or other color spaces. NTSC to YIQ Converter Block 22 could have been NTSC to YUV Converter Block 22. Whether YIQ or YUV is chosen is unimportant to the present invention. The equations for conversion to YIQ and YUV color spaces are well known.

Digital Filter Block 24 further filters the image to prevent aliasing when the image is decimated. If video telephone system 10 is working in the high resolution mode (512 by 448), Digital Filter Block 24 will be programmed so that no filtering takes place on the Y component. The U and V components will be filtered so that they may be subsampled horizontally at 128 samples per active part of the line without aliasing. If the phone is operating in the low resolution mode (128 by 112), Digital Filter Block 24 will be programmed to filter the Y image horizontally to prevent aliasing with 128 samples per active part of a line. The U and V components will be filtered to prevent aliasing when there is subsampling at 32 samples per active horizontal line. A filter that will do 2-dimensional convolution would allow filtering vertically for the Vertical Decimation Block 30.

Horizontal Decimation Block 28 may operate as follows in a preferred embodiment. If video telephone system 10 operates in the high resolution mode, no action is performed on the Y component of the image. For the U and V components, 3 out of every 4 pixels (retain every fourth pixel) are dropped horizontally, which thereby leaving 128 pixels in each active line. For low resolution mode in the Y image, 3 out of every 4 pixels are dropped (retain every fourth pixel), leaving 128 pixels horizontally. For the U and V images, 15 out of every 16 pixels (retain every sixteenth pixel) are dropped leaving 32 pixels horizontally. Simply dropping pixels is allowed because the image was properly filtered in Digital Filter Block 24.

Vertical Decimation Block 30 may operate as follows. In high resolution mode, the Y image is not affected. For U and V, Vertical Decimation Block 30 decimates by a factor of 2 by throwing out every other line (one field), and then decimates again by a factor of 2 by averaging two lines together to get one. In low resolution mode, for all images (Y,U,V), every other line is thrown away (one field). For the Y image, Vertical Decimation Block 30 decimates by 2 by averaging two lines together to get one line. This leaves 120 lines vertically. Further, 8 additional lines are thrown away (top and/or bottom) to get down to 112 lines. For the U and V images, Vertical Decimation Block 30 further decimates by averaging 8 lines together to get one line. This leaves 30 lines vertically. Two dummy lines are added at the bottom to get 32 lines vertically.

In one example, after horizontal and vertical decimation the image sizes are:

| High Resolution Mode | Y | 512 × 448 |
|---|---|---|
|  | U | 128 × 128 |
|  | V | 128 × 128 |
| Low Resolution Mode | Y | 128 × 112 |
|  | U | 32 × 32 |
|  | V | 32 × 32 |

Signal Y from NTSC to YIQ Converter Block 22 and signals from Vertical Decimation Block 30 are received by fixed frame store 40 and frame average 34.

Frame Average Block 34 may convert from 30 frames per second video to 10 frames per second video. In a preferred embodiment, Frame Average Block 34 is active only in low resolution mode. In high resolution mode, there is frame capture. Suppose P1(i,j) is a pixel in frame 1 at location (i,j). P2(i,j) and P3(i,j) are pixels in frame 2 and frame 3, respectively. Pnew(i,j), which is a new pixel, would be:

$$Pnew(i,j)=[P1(i,j)+P2(i,j)+P3(i,j)]/3$$

This averaging occurs pixel by pixel over the full frame for Y,U, and V. For the U and V images, it may be acceptable if Pnew(i,j)=P2(ij), if it made the hardware simpler.

An alternative to this processing is to scan camera 14 out at 10 frames per second, if there is control over the scan rate of the camera. This would make all the previously discussed filtering and decimation easier as it would only have to proceed at a 10 frames/second rate instead of 30 frames/second.

The present video frame is stored in Current Frame Store Block 38A and 38B, and Fixed Frame Store Block 40 for processing while the next frame is filled in.

Figure 2:
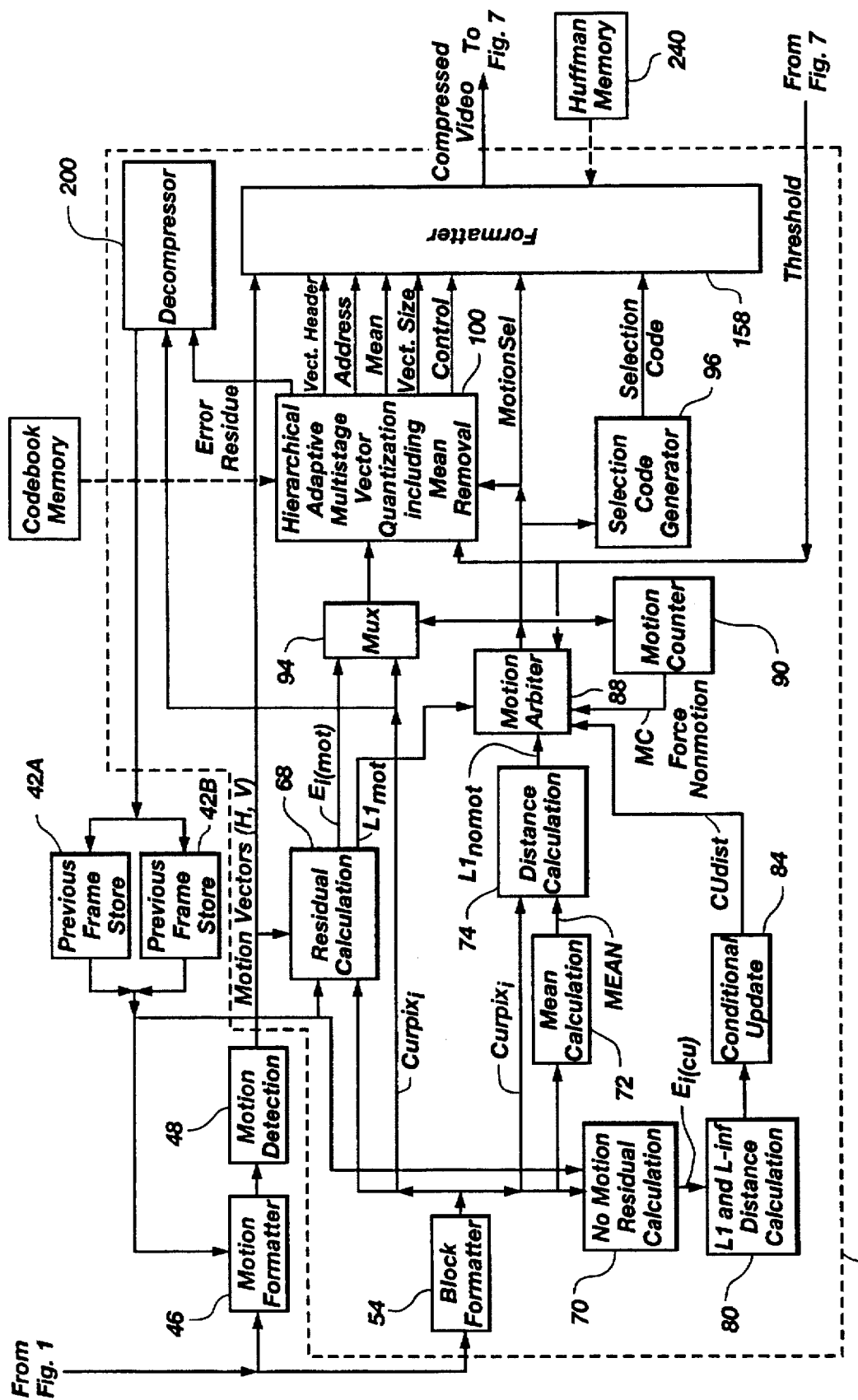
FIG. 2 is a block diagram representation of processing Blocks for preferred embodiments of a video telephone system.

Referring to FIG. 2, Previous Frame Store Buffer (or memory) 42A and 42B stores a decompressed previous frame, which is used in motion compensation mode (which may be called motion prediction) and conditional update mode. In one embodiment of the invention, previous frame operations are performed only when the system is in low resolution mode. In high resolution mode, video telephone system 10 performs mean removed intraframe VQ. Previous frame information for the Y, U, and V images is stored in Previous Frame Store Buffer 42A. Previous Frame Store Buffer 42B is used to store the present frame decoded image which will become previous frame information for the next frame. Previous Frame Store Buffer 42A and 42B ping-pong on each successive frame.

In a preferred embodiment, a motion formatter 46 formats image data into a 16×16 block in a specific manner dependent on the requirements of the motion detection circuitry. Of course, the blocks do not have to be 16×16, or even 256 pixels. For example, the shape could be 32×8.

A Motion Detection Block 48 (or motion compensator) provides an H motion vector and a V motion vector to the Motion Residual Calculator Block 68 and to Bitstream Formatter Block 158.

A Motion Detection Block 48 determines which set of pixels best forms motion previous block 66, which is a block from the previous frame that most closely corresponds to that of current block 60. (Of course, there could be a tie, in which case any of the tieing blocks is as good as another.)

One technique for accomplishing this is as follows. The current block from the current frame is subtracted from the collocated block in the previous frame pixel by pixel to generate an error residual block. The absolute values of the pixels in the error residual block are summed together to generate an $L1_{H=O, V=O}$ distance measure. This is repeated by offsetting the previous frame block by a pixel in either the vertical or horizontal direction to generate another L1 distance measure. This continues over the search area (32×32 pixels). (The search area is typically less than the entire previous frame.) The block from the previous image with the smallest L1 distance is then chosen as the best match. The offsets H and V from this block are the motion vectors. Other techniques will be apparent to those skilled in the art.

The type of motion compensation performed will be heavily dependent on what chips are available for use and economics. In one preferred embodiment, minimum requirements are:

1. 16 by 16 block size for Y,U, and V images.
2. Search range of −16 to +15 for Y and −4 to +3 for U and V.
3. Full best match L1 distance search over entire search range. ½ pixel search resolution.
4. Output of best match motion vectors.

A Block Formatter Block 54 reads a 16×16 block from the image and formats it into the proper linear pixel stream for further processing. Although various orderings could be used, the following is an example of pixel ordering to convert from image 16×16 block to linear pixel stream:

| 1 | 2 | 3 | 4 | 17 | 18 | 19 | 20 | 65 | 66 | 67 | 68 | 81 | 52 | 83 | 84 |
|---|---|---|---|---|---|---|---|---|---|---|---|---|---|---|---|
| 5 | 6 | 7 | 8 | 21 | 22 | 23 | 24 | 69 | 70 | 71 | 72 | 85 | 86 | 87 | 85 |
| 9 | 10 | 11 | 12 | 25 | 26 | 27 | 28 | 73 | 74 | 75 | 76 | 89 | 90 | 91 | 92 |
| 13 | 14 | 15 | 16 | 29 | 30 | 31 | 32 | 77 | 78 | 79 | 80 | 93 | 94 | 95 | 96 |
| 33 | 34 | 35 | 36 | 49 | 50 | 51 | 52 | 97 | 98 | 99 | 100 | 113 | 114 | 115 | 116 |
| 37 | 38 | 39 | 40 | 53 | 54 | 55 | 56 | 101 | 102 | 103 | 104 | 117 | 118 | 119 | 120 |
| 41 | 42 | 43 | 44 | 57 | 58 | 59 | 60 | 105 | 106 | 107 | 108 | 121 | 122 | 123 | 124 |
| 45 | 46 | 47 | 48 | 61 | 62 | 63 | 64 | 109 | 110 | 111 | 112 | 125 | 126 | 127 | 128 |
| 129 | 130 | 131 | 132 | 145 | 146 | 147 | 148 | 193 | 194 | 195 | 196 | 209 | 210 | 211 | 212 |
| 133 | 134 | 135 | 136 | 149 | 150 | 151 | 152 | 197 | 198 | 199 | 200 | 213 | 214 | 215 | 216 |
| 137 | 138 | 139 | 140 | 153 | 154 | 155 | 156 | 201 | 202 | 203 | 204 | 217 | 218 | 219 | 220 |
| 141 | 142 | 143 | 144 | 157 | 158 | 159 | 160 | 205 | 206 | 207 | 208 | 221 | 222 | 223 | 224 |
| 161 | 162 | 163 | 164 | 177 | 178 | 179 | 180 | 225 | 226 | 227 | 228 | 241 | 242 | 243 | 244 |
| 165 | 166 | 167 | 168 | 181 | 182 | 183 | 184 | 229 | 230 | 231 | 232 | 245 | 246 | 247 | 248 |
| 169 | 170 | 171 | 172 | 185 | 186 | 187 | 188 | 233 | 234 | 235 | 236 | 249 | 250 | 251 | 252 |
| 173 | 174 | 175 | 176 | 189 | 190 | 191 | 192 | 237 | 238 | 239 | 240 | 253 | 254 | 255 | 256 |

B. Summary of Nonmotion VQ, Motion Compensation, and Conditional Update Modes

System 10 operates in various modes including the following four modes: (1) Nonmotion VQ mode, (2) Motion Compensation Mode, (3) Conditional Update Mode, and (4) Forced Non-motion VQ Mode. On a simplified level, the four modes may be understood in context of FIGS. 3A and 3B as follows.

Figure 3A:
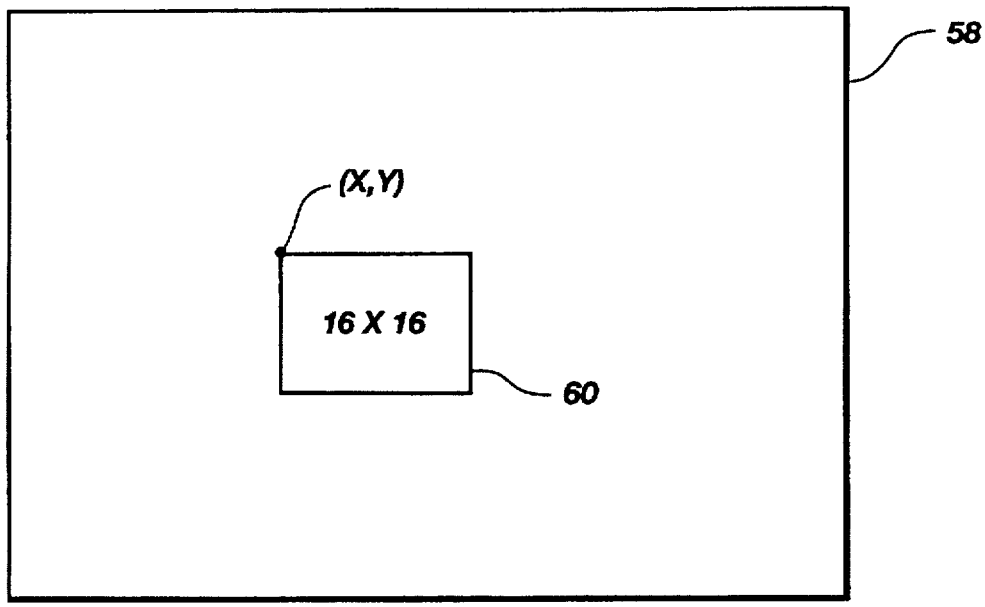
FIG. 3A is a representation of a current frame including a current block.

FIG. 3A shows a current frame 58 which includes a 16×16 current block 60. The size of 16×16 current block 60 is exaggerated with respect to current frame 58 for illustration purposes. The location of blocks is identified by a single designation pixel, which may be at the upper, left hand corner of the block. For example, the location of current block 60 is identified by a designation pixel (X, Y).

Figure 3B:
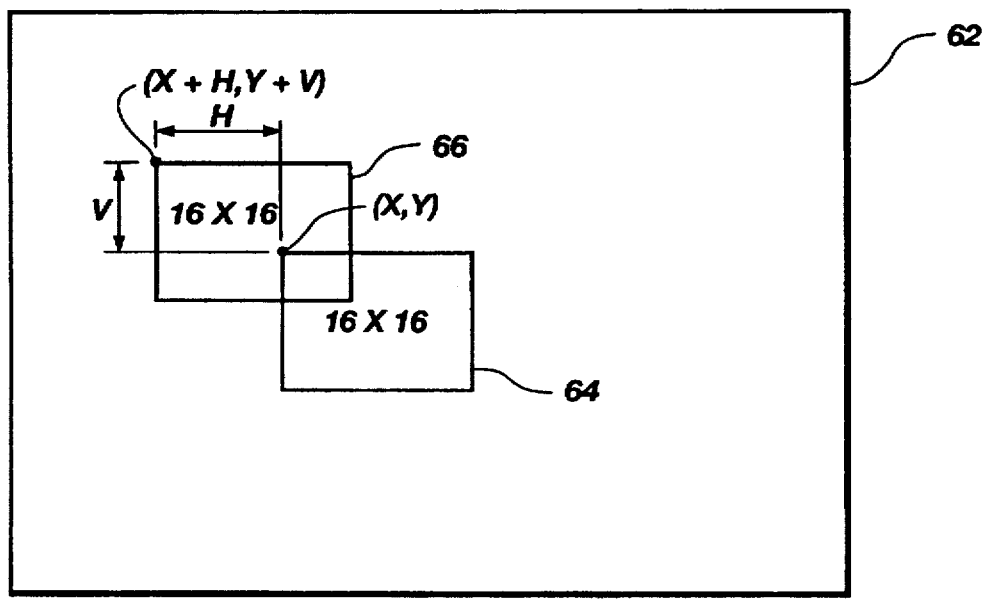
FIG. 3B is a representation of a previous frame including a motion previous block and a conditional previous block.

FIG. 3B shows a previous frame 62 which includes a 16×16 conditional previous block 64 and a 16×16 motion previous block 66. The sizes of blocks 64 and 66 are exaggerated with respect to previous frame 62. The designation pixel of conditional previous block 64 is (X, Y) and therefore occupies the same location in previous frame 62 that current block 60 occupies in current frame 58.

The designation pixel of motion previous block 66 is (X+H, Y+V), where H is the horizontal displacement and Y is the vertical displacement between designation pixels of motion previous block 66 and current block 60. Note that H and V each may be either positive or negative numbers. The location of the block which is determined to be motion previous block 66 is made through well known techniques.

Where there is no motion in the image (or an acceptable motion previous block cannot be identified), and therefore the motion vector has values H=0 and V=0, motion previous block 66 should be the same as the conditional previous block 64. System 10 may first evaluate whether conditional previous block 64 is essentially identical to current block 60, prior to attempting to locate motion previous block 66. If conditional previous block 64 is essentially identical to current block 60, then it may be unnecessary to identify motion previous block 66.

In Nonmotion VQ mode, the encoder portion of system 10 performs VQ on current block 60 and passes the compressed data to the remote decoder. The compressed data is decompressed in the remote decoder and positioned as the current frame in the remote decoder.

In Motion Compensation Mode, the encoder portion of system 10 performs VQ on the residual between current block 60 and motion previous block 66 and sends that compressed residual and a motion vector (H, V) to the remote decoder. The remote decoder then decompresses the residual and adds it to the motion previous block of the previous frame in the remote decoder. The motion previous block of the previous frame is identified by X+H and Y+V. (The previous frame is stored in both the encoder portion and the remote decoder of system 10.) The current block of the current frame in the remote decoder then becomes the sum of the decompressed residual and the motion previous block.

In Conditional Update Mode, the encoder portion of system 10 sends bits to the remote decoder which the remote decoder interprets to mean that the current block of the current frame in the remote decoder should have the data of the conditional previous block. The conditional previous block is the block in the previous frame of the remote encoder with designation pixel (X, Y).

In Forced Non-motion VQ Mode, system 10 operates the same as if in Non-motion VQ Mode.

In general, Motion Compensation Mode or Conditional Update Mode provides considerable savings in data processing, but may have slightly lower quality. Depending on the circumstances, the lower quality might not be noticeable. System 10 determines whether Motion Compensation Mode or Conditional Update Mode is acceptable.

C. Details Regarding Selecting Among Nonmotion VQ, Motion Compensation, and Conditional Update Modes A Residual Calculation Block 68 reads current block 60 from Block Formatter Block 54 and the motion vectors (H, V) from Motion Detector Block 48. Residual Calculation Block 68 also reads motion previous block 66 from previous Frame Store Block 42A or 42B, beginning at the X+H, Y+V coordinates specified by the motion vectors (H, V) in the same pixel sequence as specified above in the block formatter specification. Residual Calculation Block 68 determines the difference $E_{i(mot)}$ between pixels (Curpix$_i$) of current block 60 and pixels (Motprevpix$_i$) of motion previous block 66, according to equation (1), below:

$$E_{i(mot)} = Curpix_i - Motprevpix_i, \text{ for } i=0 \text{ to } 255 \qquad (1)$$

"Mot" refers to "motion." $E_{i(mot)}$ is an example of a residual between current block 60 and motion previous block 66.

The L1 distance (L1$_{mot}$) for the motion compensated error residual ($E_{i(mot)}$) is calculated according to equation (2), below:

$$L1_{mot} = \sum_{i=0}^{255} |E_{i(mot)}|. \qquad (2)$$

L1$_{mot}$ provides an indication of how much information is in the residual $E_{i(mot)}$.

No Motion Residual Calculation Block 72 calculates the residual $E_{i(CU)}$ between pixels (Curpix$_i$) of current block 60 and pixels (CondPrevpix$_i$) of conditional previous block 64 (see FIG. 3B), according to equation (3), below:

$$E_{i(CU)} = Curpix_i - CondPrevpix_i, \text{ for } i=0 \text{ to } 255 \qquad (3).$$

"CU" stands for conditional update. (Note that 255+1= 256 which is the number of pixels in a 16×16 block.) The motion vector for the conditional previous block is (H=0, V=0). Since the motion vector of the conditional previous block is (H=0, V=0), it is not necessary that any motion vector at all be considered in No Motion Residual Calculation Block 70. $E_{i(CU)}$ is an example of a residual between current block 60 and conditional previous block 64.

Mean Calculation Block 72 calculates the mean (MEAN) of current block 60 by summing all 256 pixels in the block and then dividing by 256, according to equation (4), below:

$$MEAN = \left( \sum_{i=0}^{255} Curpix_i \right) / 256 \qquad (4)$$

where Curpix$_i$ is the value of the ith pixel in current block 60. The division may be accomplished by dropping the 8 LSBs from the total sum.

Mean Removed Distance Calculation Block 74 determines the total L1 distance of the mean removed vector (L1$_{nomot}$) according to equation (5), below:

$$L1_{nomot} = \sum_{i=0}^{255} |Curpix_i - MEAN| \qquad (5)$$

where "nomot" stands for "no motion." MEAN is calculated according to equation (3), and curpix$_1$ are the pixels of current block 60 from which the mean was calculated. L1$_{nomot}$ gives an indication of how much information is contained in the residual following mean removal.

L1 and L-inf Distance Calculation Block 80 calculates L1$_{cu}$ (the L1 distance assuming motion) according to equation (6), below.

$$L1_{CU} = \sum_{i=0}^{255} |E_{i(CU)}| \qquad (6)$$

where $E_{i(CU)}$ is calculated according to equation (1). L1$_{CU}$ gives an indication of the amount of information in $E_{i(CU)}$.

L1 and L-inf Distance Calculation Block 80 calculates L-inf (the L-infinity distance) according to equation (7), below:

$$L\text{-}inf = MAX|E_{i(CU)}|, \text{ for } i=0 \text{ to } 255 \qquad (7)$$

where L-inf is the highest (or maximum) of the absolute values of $E_{i(CU)}$.

A Conditional Update Distance Calculation Block 84 calculates a CUdist (total distance or error for checking the conditional update condition) according to equation (8), below:

$$CUdist = ((C1*L1_{CU}) + (C2*(L\text{-}inf*C3)) \qquad (8),$$

where $L1_{cu}$ is calculated according to equation (6), L-inf is calculated according to equation (7), and C1, C2, and C3 are programmable real numbers. The symbol "*" represents multiplication. The values of C1 and C2 are chosen based on particular circumstances and allow flexibility and fine tuning ability. In the case in which current block 60 has dimensions of 16×16, C3 would preferably be 256, because L1 has 256 components.

In many cases, the average error of the conditional update residual may be relatively low. However, there may be at least one pixel for which the error is intolerably large. In such a case, if conditional previous block 64 were selected rather than current block 60, the reconstructed image may include a pixel which is noticeably inconsistent with other pixels, creating a distracting or otherwise undesirable effect.

For this reason, CUdist has two components separated by a "+" sign. The first component, $C1 * L1_{cu}$, represents the amount of information in $E_{i(cU)}$, perhaps subject to a scaling factor by C1. The second component, $(C2 * (L\text{-}inf * C3))$, represents the largest error in a single pixel. If either component is too large, CUdist is large making it more likely that conditional previous block 64 will not be chosen over current block 60.

A Motion Arbiter Block 88 decides whether system 10 is in (1) Nonmotion VQ mode, (2) Motion Compensation Mode, (3) Conditional Update Mode, and (4) Forced Nonmotion VQ Mode. To make that decision, $L1_{mot}$ of equation (2) is compared to $L1_{nomot}$ of equation (5). In essence, the comparison attempts to determine whether less information would be transmitted over a transmission link (such as a telephone wire) by performing mean removed VQ on current block 60 or performing VQ on the residual $E_{i(mot)}$.

In simplified terms, if $(L1_{mot} \leq L1_{nomot}*\text{CONSTANT})$, do the motion compensation (e.g., perform mean removed VP on $E_{i(mot)}$ of equation (1)), or perform mean removed VQ on current block 60.

CONSTANT is some writable arbitrary value. CONSTANT may be chosen to be 1.0 to simplify the circuity or software and thereby increase and/or reduce expense. The motion compensation may be called motion predicted because it uses motion previous block 66 to predict what is contained in current block 60.

The motion-nonmotion decision described above can be overridden by an update counter in Motion Counter Block 90. A counter may be kept for each block in the Y, I, and Q or Y, U, and V images. Whenever the $L1_{nomot}$ condition is selected (i.e., mean removed VQ is performed on the current block 60), the update counter is set to zero. However, if the block is sent to either motion compensation or conditional update, the update counter is incremented by 1. Before making a decision on whether to send a given block motion or non-motion, the counter is compared to a register which contains the maximum number of frames a vector may be sent motion or conditional update before forcing it to be sent non-motion.

It is desirable to avoid the possibility in which many blocks in an image are forced to be sent with non-motion VQ at approximately the same time because this would cause a large number of bits to be transmitted in a large group. Accordingly, another counter counts how many blocks have passed since the last block was forced to be sent non-motion. The final decision as to whether there is motion compensation is determined as follows. PREDFLAG is a variable the value of which is based on whether $(L1_{nomot} \leq L1_{nomot}* C4))$, where C4 is a programmable constant, i.e., whether motion compensation or non-motion VQ will occur absent an overriding event. If PREDFLAG=1, then there is motion compensation. If PREDFLAG=2, then there is non-motion.

UPDATE1 FLAG[i][j] is the update flag for block$_{i,j}$ in current frame 58. UPDATECOUNTER is the variable which counts the number of blocks since the last forced update. UPDATEFRAME is a programmble constant which indicates the maximum frames to go before forcing an update. An example value for UPDATEFRAME is 40. UPDATECOUNT is a programmable constant which indicates the number of blocks between forced updates. CUdist is the conditional update distance calculated according to equation (7) in Conditional Update Distance Calculation Block 84. The following flow chart describes the decision process.

```
If (L1_mot ≤ (L1_nomot * CONST)
    PREDFLAG = 1; (motion)
else
    PREDFLAG = 2; (non-motion)
If((PREDFLAG==1) && (UPDATEFLAG[i][j] > UPDATEFRAME))
{
    If(UPDATECOUNTER ≥ UPDATECOUNT)
    {
        PREDFLAG = 2;
        UPDATECOUNTER = 0;
    }
    else
    {
        UPDATECOUNT=UPDATECOUNT + 1;
    }
}
If(PREDFLAG==2)
{
    UPDATEFLAG[i][j]=0;
    Do non-motion compensated VQ
    (i.e. perform mean removed
    VQ on current block 60)
}
else
{
    UPDATEFLAG[i][j]=UPDATEFLAG[i][j]+ 1;
}
If(PREDFLAG == 1)
{
    IF((CUdist < THRESHOLD)
        Do conditional update (e.g., sending two bits
        indicating that previously quantized block is adequate)
    Else
        Do motion compensation (e.g., Perform VQ on
        E_i(mot) from equation (1))
}
``` where PREDFLAG, UPDATECOUNT, UPDATEFLAG, UPDATEFRAME, CUdist, $L1_{mot}$, and $L1_{nomot}$ are described above, and C4 and THRESHOLD are programmable constants chosen to meet particular needs.

In a preferred embodiment, when system 10 is in high resolution mode, PREDFLAG will always be 2 as mean removed VQ is performed on every current block (ie., system 10 operates in non-motion mode).

An alternative simplified algorithm is presented as follows:

If (MOTIONCOUNTER=1)
    then do non-motion VQ
Else if (CUdist<THRESHOLD)
    then do conditional update
Else if $(L1_{mot} \leq L1_{nomot}* C4)$
    then do motion compensated VQ
Else
    do non-motion VQ.

wherein MOTIONCOUNTER is the value of motion counter 90 after a predetermined number of frames have passed, current block 60 has been vector quantized (called non-motion VQ), and CUdist, THRESHOLD, $L1_{mot}$, $L1_{nomot}$, and C4 are described above.

MUX Block 94 passes $E_{imot}$ (the motion compensation residual) or current block 60 as a vector to the VQ compressor based on the results of Motion Arbiter Block 88.

Selection Code Generator Block 96 generates a selection code appropriate to the mode chosen by Motion Arbiter Block 88. Each 16×16 block of compressed image data requires a 1 or 2 bit header. This header is as follows:

| | |
|---|---|
| Motion Compensation VQ | header = 0 |
| Non-motion VQ | header = 10 |
| Conditional update | header = 11 |

The header is put into the bit stream to the decoder and indicates to the decoder what to expect. If conditional update is chosen, only a header is sent for the block. If non-motion VQ is chosen, the header plus all VQ information pertaining to that block is sent. If motion compensation VQ is chosen, the header plus the motion vectors plus all VQ information pertaining to that block are sent.

Figure 4:
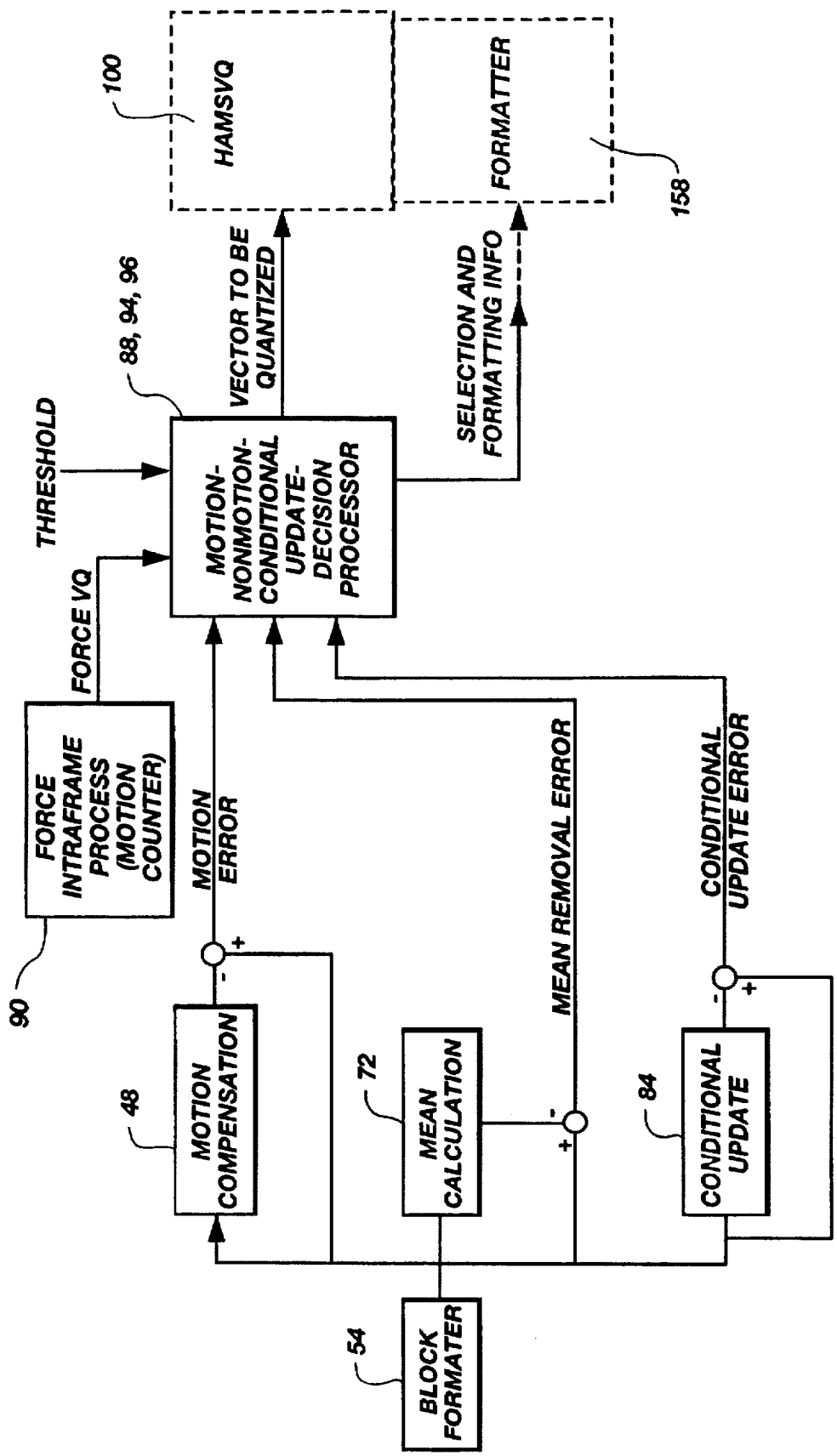
FIG. 4 is a block diagram representation of a simplified representation of a portion of the processing Blocks of FIG. 2.

FIG. 4 shows a more simplified version of FIG. 2.

The following chart summarizes the response of system 10 in a preferred embodiment, if certain conditions are met.

| Mode | Response |
|---|---|
| Motion Compensation Mode | Perform mean removed VQ on $E_{i(mot)}$ from equation (1) and add the results the decoded motion previous block in the remote decoder 250 |
| Non-motion VQ Mode | Perform mean removed VQ on current block |
| Conditional Update Mode | Send bits (e.g., two bits) to decoder indicating that previously quantized block is adequate |
| Forced Non-motion VQ Mode | Response same as if Non-motion VQ mode selected |

D. Hierarchical Adaptive Multistage VQ

Figure 5:
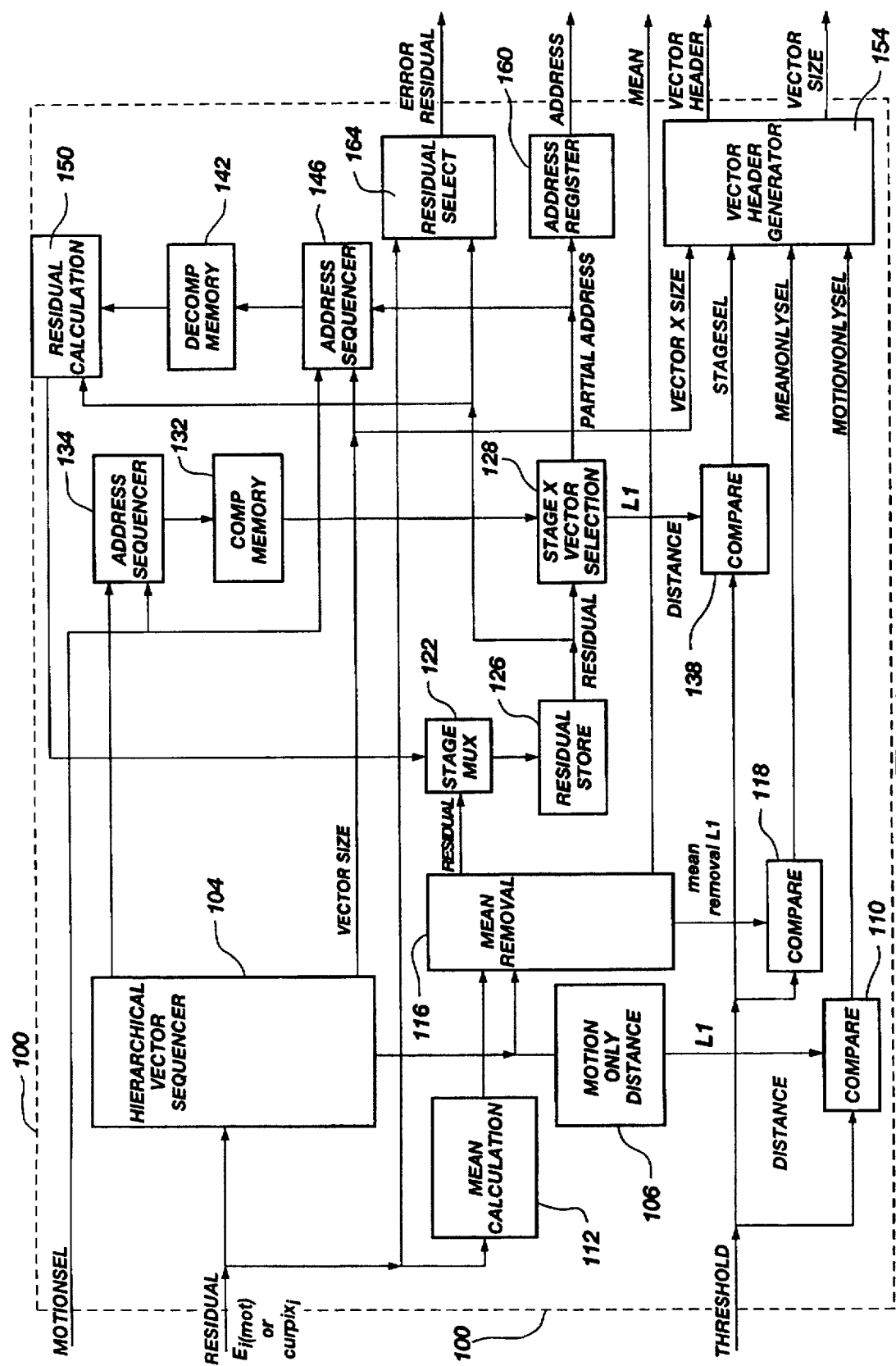
FIG. 5 is a block diagram representation of details of processing Blocks of Hierarchical Adaptive Multistage VQ Block of FIG. 2.
Figure 6:
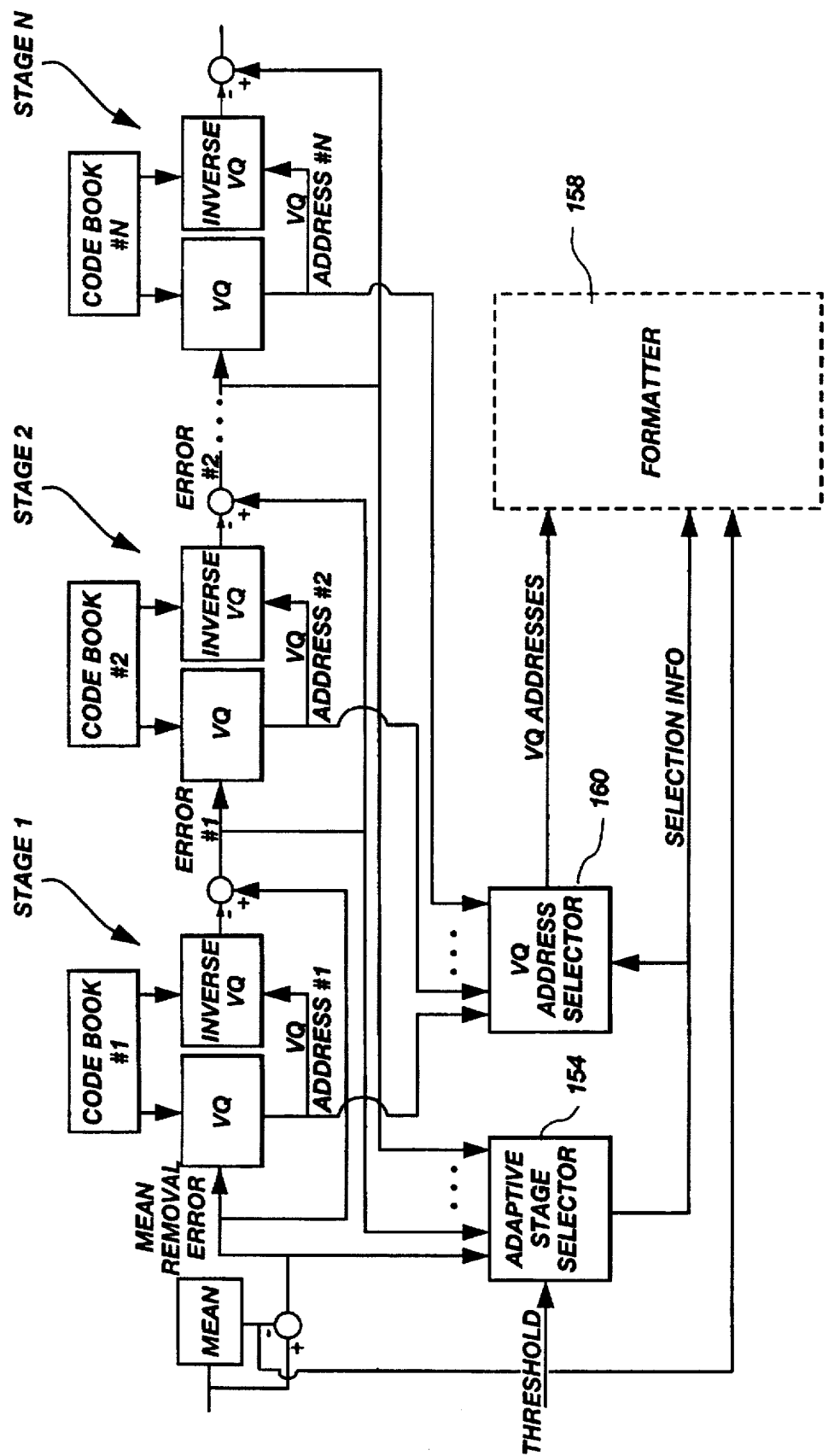
FIG. 6 is a alternative simplified representation of the Hierarchical Adaptive Multistage VQ Block of FIGS. 2 and 5.

Hierarchical Adaptive Multistage VQ Block 100 may operate as follows. Block 100 performs encoding functions. Details of Hierarchical Adaptive Multistage VQ Block 100 are shown in FIG. 5. FIG. 6 shows a simplified version of the Block of FIG. 5. In summary, Hierarchical Adaptive Multistage VQ Block 100 breaks a block into smaller parts until the L1 distance is <THRESHOLD. (Of course, a >relationship could be chosen.) The THRESHOLD in Block 100 is preferably the same as THRESHOLD in Block 88. The L1 distance is calculated similar to that of equation (2), although other distance measurements could be used. Except in a still frame mode described below, THRESHOLD is adaptive controlled based on the amount of data in the buffer. The adaptive control maintains a constant bit rate.

Before describing the details, a general description of the algorithm of Hierarchical Adaptive Multistage VQ Block 100 is provided. There are two codebooks used for the VQ process. One is for mean removed-motion compensated residuals; and one is for mean removed non-motion residuals. The two codebooks are the same size and configuration. Each 16×16 block of image may be encoded using different VQ vector sizes. The sizes may be:

16×16
16×8
8×8
8×4
4×4
4×2

Some sizes, e.g., 16×8, might not be included. Other sizes could be used.

Merely as an example and not a limitation, for each vector size, a multistage VQ search is performed with 4 bits per stage for 6 stages. The total codebook size is as follows:

16×16=(16×16 pix/vec)*(16 entries/stage)*(6 stages)= 24576 words (each word is 9 bits) 16×8=(16×8 pix/vec)*(16 entries/stage)*(6 stages)=12288 words etc.

each smaller vector size is ½ the size of the one previous. Total codebook size=48384 words.

There are two complete sets of codebooks, so the Total codebook size=96768 words.

Beginning with the 16×16 vector size, the L1 distance at that stage is compared to THRESHOLD*CONST1 (where CONST1 is some writable constant that may be different between motion blocks and non-motion blocks; typically THRESHOLD could be lower for non-motion blocks). If the L1 distance is <THRESHOLD, the search is satisfied at that stage. If not, the error residual from the present stage is compared to the codebook at the next stage, etc. If the last stage is reached without finding a solution to THRESHOLD, the 16×16 vector is divided into smaller vectors and the same process is repeated for this block size (only now L1 distance is compared to THRESHOLD*CONST1*CONST2, where CONST2 is some programmable value, typically 0.5 to 0.6). This continues until either a threshold solution is found at some block size and stage, or until the last block of the vectors (e.g. 4×2) is reached.

For each vector size, the possible points of completion are as follows:

1. Compensation only (occurs when L1 distance for $E_{i(mot)}$<THRESHOLD; can only occur when Motion Compensation Mode selected)
2. Mean only (occurs when the error residual after mean removal is less than THRESHOLD; can occur when Motion Compensation Mode or Non-motion VQ Mode selected)
3. VQ stage 1
4. VQ stage 2
5. VQ stage 3
6. VQ stage 4
7. VQ stage 5
8. VQ stage 6

Hierarchical Adaptive Multistage VQ Block 100 is adaptive in two directions. First, THRESHOLD is adaptive in the direction of points 1., 2., 3 . . . 8. Second, THRESHOLD is adaptive as the block is divided into increasingly smaller vectors.

The details of Hierarchical Adaptive Multistage VQ Block 100 are now described with reference to FIG. 5.

Hierarchical Vector Sequencer Block 104 latches the 256 pixel residual vector. Vector Sequencer Block 104 subdivides the vector into smaller vectors, according to the algorithm. Vector Sequencer Block 104 creates two 128 pixel vectors by dividing the 256 pixel vector in half. Vector Sequencer Block 104 then subdivides each of these into two 64 pixel vectors, etc. until it is broken down into thirty two 8 pixel vectors. In the case where the functions are implemented in hardware, it may make sense to have the hardware divide and perform VQ on the divided portion of each block, whether or not the block needs to be divided. In software, it would probably make sense to divide a block only if it is needed.

In Motion Compensation Only Distance Calculation Block 106, the L1 distance of each vector size is compared to THRESHOLD. The L1 distance is calculated by summing up the absolute value of each pixel in the residual vector.

In Motion Compensation Only Distance Compare Block 110, the L1 distance calculated for each vector size is compared to THRESHOLD as follows:

L1(16×16)<THRESHOLD *CONST1$^1$
L1(16×8)<THRESHOLD * CONST1$^2$
L1(8×8)<THRESHOLD * CONST1$^3$

L1(8×4)<THRESHOLD * CONST1$^4$
L1(4×4)<THRESHOLD * CONST1$^5$
L1(4×2)<THRESHOLD * CONST1$^6$
where CONST1 is some writable constant (typically 0.5 to 0.6). CONST1$^2$=CONST1 * CONST1; CONST1$^3$= CONST1 * CONST1 * CONST1; etc. The power of CONST1 increases because fewer pixels are involved. The TRUE—FALSE result of this comparison is sent to Vector Header Generator Block 154.

In Mean Calculation Block 112, the mean of each vector size is calculated by summing up all pixels in the vector and dividing by the number of pixels in the vector. (Note that the mean is recalculated so that the output of Mean Calculation Block 72 is not necessary, although it could be used.) It is expected that it will be easiest to calculate the mean of all the 4×2 blocks and then use these means to build up means for larger blocks, for example:

MEAN(4×4)=(MEAN(4×2#1)+MEAN(4×2#2))/2
MEAN(8×4)=(MEAN(4×2#1)+MEAN(4×2#2)+MEAN(4×2#3)+MEAN(4×2#4))/ 4 etc.

In a hardware implementation, the MEAN may be calculated for 2×2 divided blocks first and averaged if the larger block is less than THRESHOLD.

In Mean Removal and L1 Distance Calculation Block 116, the mean value for each vector is subtracted from each pixel in the vector. The L1 distance for each vector size is then calculated by summing up the absolute value of each pixel in the mean removed vector.

In Mean Only Distance Compare Block 118, the L1 distance calculated for mean only residual for each vector size is compared to THRESHOLD in the same manner as for motion compensation only. The following is an example:

L1(16×16)<THRESHOLD * CONST1$^1$
L1(16×8)<THRESHOLD * CONST1$^2$
L1(8×8)<THRESHOLD * CONST1$^3$
L1(8×4)<THRESHOLD * CONST1$^4$
L1(4×4)<THRESHOLD * CONST1$^5$
L1(4×2)<THREHOLD * CONST1$^6$ where CONST1 is some writable constant (typically 0.5 to 0.6). The TRUE—FALSE result of this comparison is sent to Vector Header Generator Block 154.

Stage MUX Block 122 chooses whether to load in a new vector for VQ comparison or to load in a residual vector which is the residual from a previous stage of VQ comparison.

Residual Store Block 126 is used to store a vector which is due to be compared to a VQ codebook.

Stage X Vector Selection Block 128 is the VQ comparison core. Various structures for implementing Stage X Vector Selection Block 128 will be apparent to those skilled in the art with U.S. Pat. No. 5,031,037 to Israelsen, entitled "Method and Apparatus for Vector Quantization Parallel Processing," providing an example. Stage X Vector Selection Block 128 compares the incoming vector (9 bit data) to 16 codebook entries simultaneously, and outputs the 4 bit address of the codebook entry which had the smallest L1 distance measure.

Off-chip Encode Codebook Memory Block 132 contains the VQ comparison codebooks. As specified above, the total size of this memory is 96768 nine bit words. It is broken into 8 separate chips of 12096 words each. Each memory chip has a separate bus which connects to the VQ comparison circuitry. In a preferred embodiment, these codebook memories are accessed twice per input pixel comparison. The even codebook entries are loaded on the falling clock edge and odd codebook entries are loaded on the rising clock edge. As each 16×16 block is processed 36 times (6 different vector sizes times 6 stages per vector size), the approximate access time of these memories can be calculated. As an example, (64 blocks/frame)*(256 pixels/block)*(10 frames/sec)= 163,840 pixels / second (163,840 pix/sec)*(36 compares/ pix)=5,898,240 compares/sec (5,898,240 compares/sec)*(2 mem access/compare)=11,796,480 memory accesses per second This is about 84 nanoseconds per codebook access.

Encoder Codebook Memory Address Sequencer Block 134 generates the memory address for accessing the codebook memories. The address consists of OFFSET1 based on motion or non-motion processing, OFFSET2 based on the current vector size being processed, OFFSET3 based on the current stage of the multi-stage search, and PIXADDRESS determined by the current pixel being compared against. MEMADDRESS=OFFSET1+OFFSET2+OFFSET3+PIXADDRESS In VQ Residual L1 Distance Compare Block 138, the L1 distance of the best match vector (from VQ Stage Selector Block 128) is compared to the THRESHOLD as it was with compensation only and with mean only. For example, L1(16×16)<THRESHOLD * CONST1$^1$
L1(16×8)<THRESHOLD * CONST1$^2$
L1(8×8)<THRESHOLD * CONST1$^3$
L1(8×4)<THRESHOLD * CONST1$^4$
L1(4×4)<THRESHOLD * CONST1$^5$
L1(4×2)<THRESHOLD * CONST1$^6$ where CONST1 is some writable constant (typically 0.5 to 0.6). The TRUE—FALSE result of this comparison is sent to the vector header generator 154.

Off-Chip Decompression Codebook Memory Block 142 contains the VQ codebooks for decompressing each stage of the multistage search in order to generate the residual for the following stage. It contains the same information as the encoder codebooks, but in a different format. In the example provided herein, the total size of this memory is 96,768 nine bit words just like the encoder memory. This decoder codebook may be contained in a single separate memory chip, or it may be contained in the same memory chips as the encoder codebook. This codebook is accessed only once per pixel comparison cycle so the access time is half the encoder access time or 168 nanoseconds.

Decoder Codebook Memory Address Sequencer Block 146 generates the address to access memory locations in the decoder memory. The address is composed of OFFSET1 based on motion or non-motion processing, OFFSET2 based on the current vector size being processed, OFFSET3 based on the current VQ comparison stage, OFFSET4 based on the 4 bit address of the best match from the encoder, and PIXADDRESS based on the pixel location within the vector being accessed.

MEMADDRESS=OFFSET1+OFFSET2+OFFSET3+OFFSET4+PIXADDRESS

Residual Calculation Block 150 takes the current vector being compared and subtracts from it (pixel by pixel) the corresponding decoded vector being read in from the Decompression Codebook Memory Block 142. This generates the residual to be used for the next stage of multi-stage VQ comparison.

A Vector Header Generator Block 154 receives the results of L1 distance comparison to the THRESHOLD from the Compensation Only Block 110, the Mean Only Block 118, and the Multistage VQ Comparison Block 138. A word is generated which is sent to the Video Formatter Block 158 which specifies at which block size threshold comparison is satisfied. It is desirable to accept the largest block size at which there is a threshold solution. A three bit vector header word is also generated which specifies at which level of the multi-stage search a threshold solution was found. The vector header is described as follows:

Compensation Only 000 note: This can only occur for motion compensation blocks.
  Mean Only 001
  VQ Multi-stage #1 010
  VQ Multi-stage #2 011
  VQ Multi-stage #3 100
  VQ Multi-stage #4 101
  VQ Multi-stage #5 110
  VQ Multi-stage #6 111

VQ address register 160 stores the 4 bit address which comes from the VQ multi-stage search. It behaves like a 4 bit wide FIFO. It may actually be a FIFO, or it could be addressable RAM. At each stage of the VQ multi-stage search where L1 distance≧THRESHOLD, the 4 bit best match address is entered into the FIFO. At the first stage at which L1 distance <THRESHOLD, the address is entered into the FIFO, but at succeeding stages it is not. The Video Formatter Block 158 ascertains how many 4 bit addresses to read from the FIFO based on the vector header supplied by the vector header generator 154. If at this vector size stage 6 is reached without finding a threshold solution, then the video formatter reads all the addresses from the FIFO and discards them. A MotionSel signal indicates to Video Formatter Block 158 whether motion compensation or non-motion VQ is selected by Motion Arbiter Block 88.

Residue Select Block 164 selects (and possibly stores) the vector residual pixels that are existing when a solution to the threshold inequality is found. These are then made available to the Decompressor Block 200 to generate the decoded image which in the next frame will become the previous frame.

Referring to FIG. 2, decompressor 200 is responsible for generating the decompressed image which will become the previous image when processing of the next frame is begun. The decompressed image is stored into the present frame half of frame store 42A and 42B. This decompressed image looks exactly like the decompressed image that is being generated in the receiving decoder at the other end of the line. The decompressor has one of three conditions it operates in.

1. Conditional update

In the case of conditional update of a 16×16 block, the decompressor simply takes the 16×16 block from the previous frame buffer 42A and 42B beginning at the present (H,V) location and places it into the current half of previous frame buffer 42A or 42B at the present H,V location.

2. Motion Compensation only

The decompressor 200 takes the 16×16 block from the previous frame buffer 42A and 42B beginning at location X+H, Y+V and places it into the current half of previous frame buffer 42A or 42B at the present H,V location.

3. Motion Compensation or non-motion plus mean removal plus possibly VQ stages

The decompressed image could be reproduced by adding up all the components that go into decompression (motion residual, mean, VQ codebooks values). This is the approach that the decoder uses in the receiving end.

In all three cases, the final residual which comes out of the VQ section (which is the final error residual) is subtracted pixel by pixel from the original image vector PRESENTFRA(0,0). This will produce the same decoded image. This image is then placed into the current half of the previous frame buffer 42A or 42B at the present H, V location. In case number 1 the residual which passes through will be PRESENTFRAE(0,0)—PREVIOUSFRAME(0,0). In case number 2 the residual will be PRESENTFRAME(0, 0)—PREVIOUSFRAME(H1, V1) where H1 and V1 are the motion vectors. In case 3, the residual will be the final residual after mean removal and VQ.

Video formatter 158 reads the selection code from the selection code generator 96, the motion vectors from the motion vector latch, and the vector size, the vector header, the vector mean, and the vector address from the HAMSVQ Block 100. It is responsible for Huffman coding the nine bit mean data. The X and Y motion vectors as well as the VQ vector header are also Huffman coded. It then formats and packs this information into an output data stream and latches it to the outside world. The outside world is responsible for reading all the latched information within a block cycle so that it can be replaced in the next block. Actually it might be a good idea to have a small FIFO here in the output.

The video output for each 16×16 input block is composed as follows:

1. Block Header:

If the selection code specifies motion compensation, then the block header is composed of a 0 followed by a Huffman coded X motion vector followed by a Huffman coded Y motion vector.

If the selection code specifies non-motion, the block header consists of the two bits 10.

If the selection code specifies conditional update the block header consists of the two bits 11.

2. Block Body:

If the block header specifies conditional update then the block body is empty. If the block header specifies either motion compensation or non-motion, the block body is made up of vector subdivision bits followed by vector header, followed by possibly Huffman coded vector mean, followed by possibly vector address data for each vector size used.

If for a given vector size (beginning at 16×16 and going down to 4×2) a threshold solution was found, then the vector subdivision bit is set to 0. This is then followed by the Huffman coded vector header. This is then optionally followed by the Huffman coded mean, which is optionally followed by one or more 4 bit VQ addresses.

If for a given vector size (beginning at 16×16 and going down to 4×2) a threshold solution was not found then the vector subdivision bit is set to 1. It is then known that there will be no further bits following for this vector size. Therefore, the 1 is followed by the vector subdivision bit for the first half of the subdivided vector which is optionally followed by information for that subdivided vector. This is then followed by the vector subdivision bit for the second half of the subdivided vector which is optionally followed by information for that subdivided vector. This continues until a solution has been found for all portions of the 16×16 block.

If 4×2 vectors are reached, then it is not necessary to have a vector subdivision bit inserted as they cannot be subdivided. Also, if the last VQ stage of a 4×2 vector is reached without finding a solution to L1 distance<THRESHOLD, the mean plus 24 bits of VQ address for that 4×2 vector is used.

This section is also responsible for Huffman coding the mean words, the H and V motion vectors, and the vector header. The mean words arrive as nine bit signed numbers from −256 to +255. A histogram of the mean values shows they are highly clustered around zero. About 85% of the occurrences fall between +10 and −10. If a limited set of Huffman words that cover data between +N and −N is built, then the incoming mean value is checked to see if it falls within our range. If it does, then the Huffman lookup table (2N values) is looked into and pulled out. If it does not fall within the range, the mean value as a Huffman header plus the raw data is sent. The Motion vectors are 6 bit values which are Huffman coded to variable length. The Vector headers are 3 bit values which are Huffman coded to variable length. All Huffman tables are stored in writable tables.

E. Output Blocks and Threshold

Figure 7:
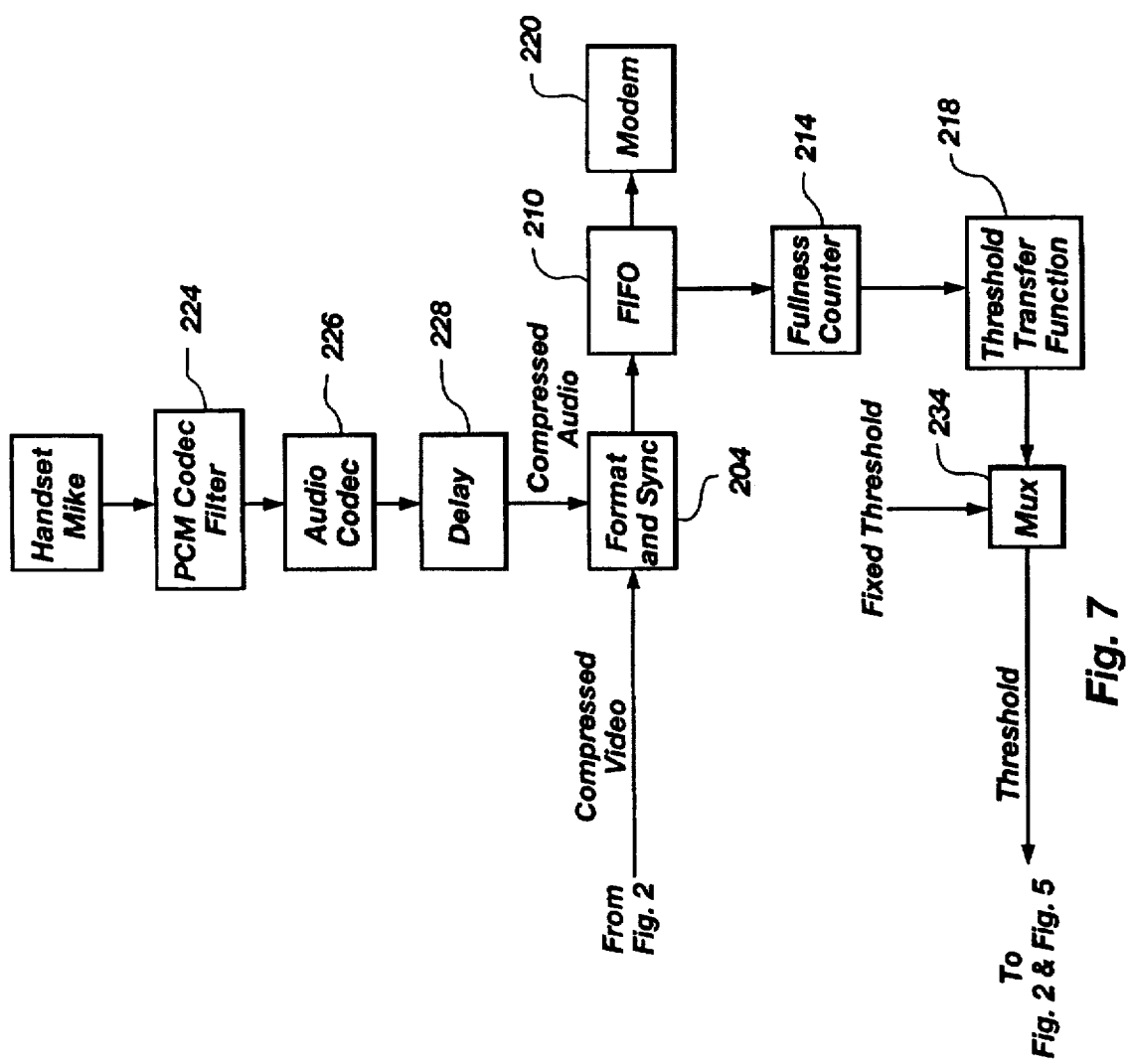
FIG. 7 is a block diagram representation of final processing Blocks which receives a compressed video signal from the processing Blocks of FIG. 2.
Figure 8:
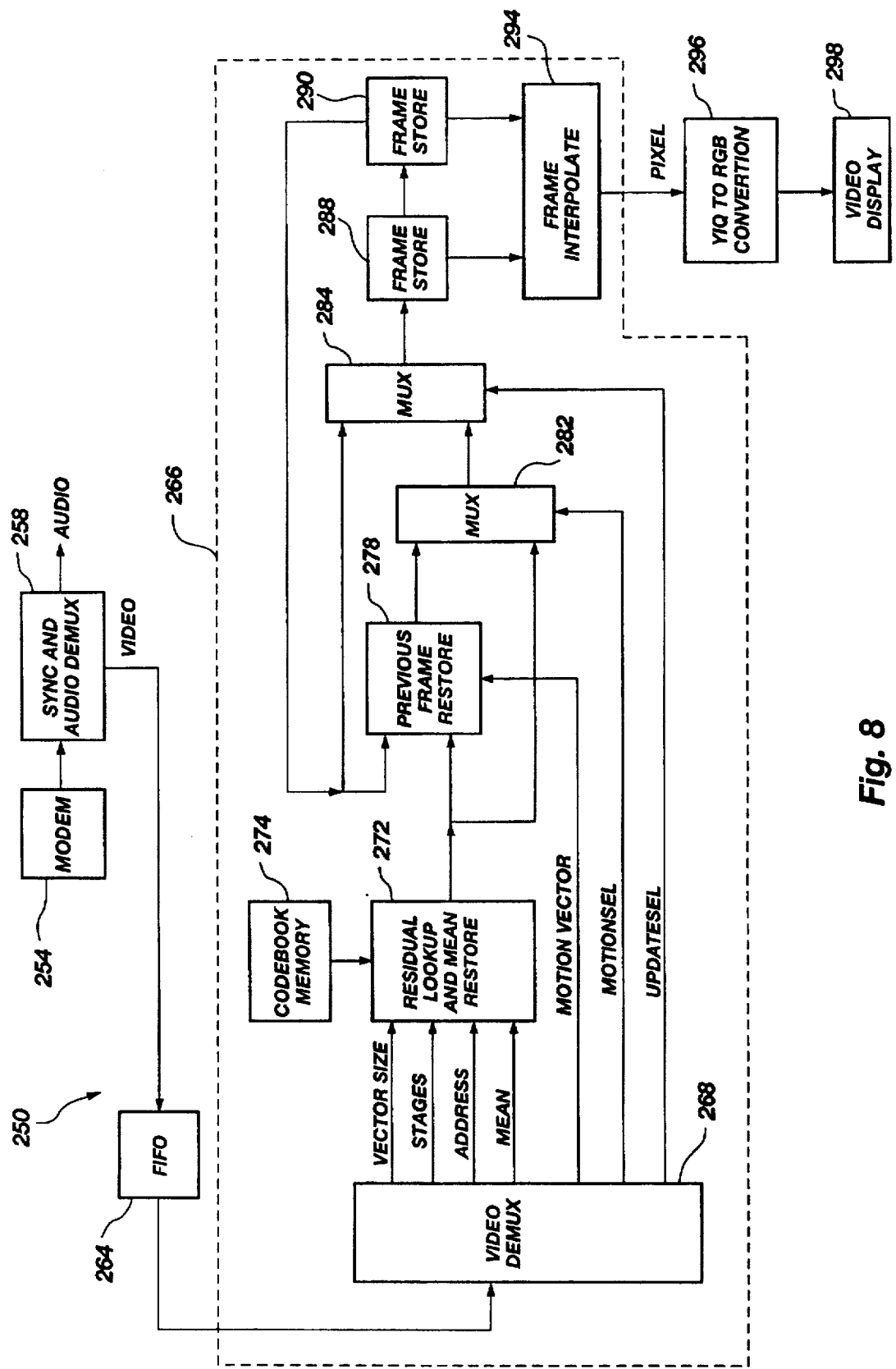
FIG. 8 is a block diagram representation of decompression Blocks at a location remote from the Blocks of FIGS. 1–2 and 4–7.

Referring to FIG. 7, a Format and Sync Block 204 adds the audio information into the video data stream and then inserts a frame sync word at the end of a frame. This allows resyncing of the decoder to the data stream. Bits for error correction may also be added at this point if it is deemed to be necessary or desirable.

Adaptive threshold feedback will now be discussed. An Output FIFO Block 210 stores the data as it is waiting to be transmitted by the modem. FIFO Block 210 is an example (but only an example) of a port to modem 220 and the transmission link (such as a telephone line) to a remote modem. Modem 220 may be thought of as a part of the transmission link. Alternatively, modem, 220 may be thought of as a port. FIFO Block 210 should be about 64 Kbits large. FIFO Block 210 should not be allowed to empty or to overflow. This is controlled by the THRESHOLD feedback going into the video processor. The rate at which data is removed from the FIFO is controlled by the transmission rate of the modem.

To control the THRESHOLD going back into the video processor, a FIFO Fullness Counter 214 determines how full the FIFO is at all times. Each time a bit is entered into the FIFO the fullness counter is incremented by 1. Each time a bit is removed from the FIFO to go into the modem the counter is decremented by 1. It may be that if the FIFO is word based rather than bit based, that incrementing and decrementing is on each word insertion or removal rather than on a bit by bit basis.

Threshold Transfer Function Block 218 is a lookup table that maps the FIFO fullness to the THRESHOLD which is used to control the compressed video data rate. The output of the FIFO fullness counter 214 is the address to this table and the data output is the THRESHOLD. The transfer function may look something like this:

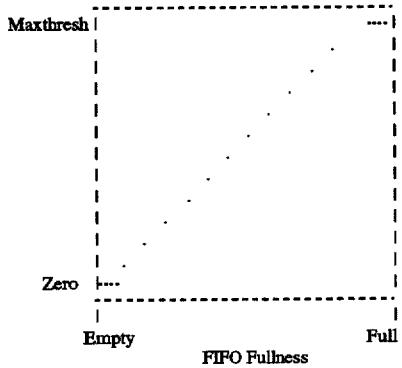

In the graph, the vertical axis represents THRESHOLD. THRESHOLD does not have to be linear. For some applications, various non-linear functions may be more desirable.

The Threshold Multiplexor Block 234 selects either the threshold from the threshold transfer function block or a fixed threshold supplied by the Host controller. The fixed threshold may be useful when high quality still images are processed through system 10. When operating in videophone mode (10 frames/second), it selects the threshold from the table. When operating in the still frame mode, it selects the fixed threshold from the Host. This threshold is latched into the video processor ASIC on each 16×16 block cycle.

An appropriate modem 220 and associated circuitry should be selected. For example, such a modem may be a V.34 modem capable of supporting at least 28.8 bits per second transfer rate and may operate in an asynchronous or a synchronous mode of operation. It would also be useful to have error detection and correction in synchronous mode. In some applications the modem may be replaced by some other transport medium such as ISDN, Ethernet, ATM, etc.

Audio Processing Blocks 224, 226, and 228 may be performed by an audio processing chip with associated circuitry. The compressed audio data rate may be around 4800 bits per second. The audio compression algorithm may actually be done in software in the main computer CPU if a suitable algorithm is available.

F. Remote Decoder

Referring to FIG. 8, a remote decoder system 250 of system 10 receives compressed vector quantized video signals through modem 254, which is a counterpart to modem 220 in FIG. 7. A Sync and Audio Demux Block 258 does error correction if error correction bits have been added in the encoder. Block 258 then looks for the frame sync word and resynchronizes the data stream if needed. Block 258 then strips out the audio bits and sends them off to the audio decoder. The video data stream is then put into the video FIFO in 32 bit widths.

A Video FIFO Block 264 is a 32 bit wide FIFO which stores the compressed data stream for decompression. The FIFO must have an output which tells when the FIFO is empty so that the decompressor will not try to read data from the FIFO when no data is available.

A Video Decoder Block 266 may be implemented using a DSP (digital signal processing chip), or it may be implemented in the main CPU of a Personal Computer (PC) or it may be implemented in dedicated hardware. A Video Demux Block 268, Residual Lookup and Mean Restore Block 272, Codebook Memory Block 274, Previous Frame Restore 278, Mux Block 282, Mux Block 284, Frame Store Block 288, Frame Store Block 290, and Frame Interpolater Block 294 are described operationally rather than in a hardware block diagram approach. The Video Demux Block 268 performs the inverse operation of the Video Formatter Block in the encoder shown in FIG. 2. Video Demux Block 268 parses the compressed data stream and determines whether a block was compressed with motion compensation or non-motion. Video Demux Block 268 then strips out the motion vectors (H,V) if they are present. Video Demux Block 268 must then determine at which block sizes and stages the block was compressed and generate the mean and VQ addresses necessary to reconstruct the block. The data stream for each 16×16 block looks like this:

Video Demux Block 268 begins by looking at the first bit of the block. If this bit is a 0, then the block was encoded using motion compensation and the next N bits are the Huffman coded H motion vector which is followed by the M bit Huffman coded V motion vector. If the first bit is a 1, it checks the next bit. If the next bit is a 0, the block was coded with non-motion VQ. If the second bit is a 1, the block was encoded conditional update and there will be no more bits of data for this 16×16 block.

2. BLOCK BODY:

If the 16×16 block was coded as either motion compensation or non-motion, then after the block header has been read, it is necessary to then parse the stream to determine how the block was encoded.

a. Block body bit one=0:

If the first bit of the block body is a 0, the 16×16 block was encoded with a single 16×16 vector. The next N bits are the Huffman coded vector header which describes at what stage of the multi-stage search the vector was compressed to. The vector header is defined as:

Compensation Only 000 note: This can only occur for motion compensation blocks.
Mean Only 001
VQ Multi-stage #1 010
VQ Multi-stage #2 011
VQ Multi-stage #3 100
VQ Multi-stage #4 101
VQ Multi-stage #5 110
VQ Multi-stage #6 111

If the vector header is 000, then the vector was compressed as compensation only and there will be no more bits for this 16×16 block.

If the vector header is 001, then the vector was compressed as mean only. The next N bits are the Huffman coded mean value. These N bits must be Huffman decoded to generate the nine bit mean value.

If the vector header is 010, then the vector was compressed as mean removed 1 stage multi-stage VQ. The next N bits are the Huffman coded mean value, with the following 4 bits being the VQ address of the first stage of multi-stage VQ.

If the vector header is 011 through 111, then the vector was compressed with M stages of multi-stage VQ. After the N bit Huffman mean there will be four bits of VQ address for each stage of the multi-stage VQ. At this point the 16×16 block has been completely disassembled.

b. Block body bit=1:

If the first bit of the block body is a one, then it is known that the 16×16 block was subdivided into at least two 16×8 vectors. The next bit gives information about the first 16×8 vector. If it is a zero, then the same process is gone through for this 16×8 vector as was for the 16×16 vector described above. If it is a one, then it is known that this 16×8 vector was subdivided into at least two 8×8 vectors.

After all bits for the first 16×8 vector are looked at, then the next bit is the subdivision bit for the second 16×8 vector. It is treated just as the first 16×8 vector was treated.

This process continues until it is determined at which vector size all portions of the 16×16 block were encoded. If the point where 4×2 vectors are expected is reached, it is known that these vectors will not have subdivision bits associated with them as they cannot be subdivided.

Residual Lookup and Mean Restore Block 272 takes the Huffman coded mean value for each vector, performs a Huffman decode, and conditionally adds it to the pixel values from the Codebook Memory Block 274 which are read from memory offset specified by the 4 bit address for the first stage of the multi-stage search. This is then optionally accumulated to the pixels read in for the second 4 bit address of the multi-stage search. This continues as long as there are valid 4 bit addresses for each successive stage.

The Codebook Memory Block 274 may be external memory which contains the codebooks in a format much like the decompressor codebook memory in the encoder. The total size of this memory is 96,768 nine bit words just like the encoder memory. This codebook is preferably contained in one chip.

Previous Frame Restore Block 278 may operate as follows. If the 16×16 block was encoded to motion compensation VQ, then the 16×16 output from Residual Lookup and Mean Restore Block 272 is added pixel by pixel to the 16×16 image block retrieved from the Previous Frame Store Block 290 with block offset at location H, V).

Image Selection Mux Block 282, 284 selects which image will be displayed based on whether system is in conditional update, motion compensation VQ, or non-motion VQ mode. If all this processing is done in a DSP, or in the computer main CPU, then this block really does not exist as actually only the specific image to be displayed is decoded.

Frame Store Block 288, 290 is in two parts. One part is the previous decoded frame which is used for retrieving conditional update and motion compensation pixels. The second part is the present decoded frame which will become the previous frame in the next frame cycle. These frame stores are ping-ponged on each successive frame.

Frame interpolater 294 may operate as follows.
At this point the video looks like this:
Still frame mode:

$Y=512\times448$ $I=128\times112$ $U=128\times112$

Video Phone mode:

$Y=128\times112$ $I=32\times28$ $U=32\times28$

At 10 frames per second.

1. TEMPORAL INTERPOLATION

In video phone mode, the Y, I, and Q images may be temporally interpolated from 10 frames per second to 30 frames per second. If frames F1 and F2 are decoded at 10 frames per second and it is desired to generate missing frames F1a and F1b:

| F1 | F1a | F1b | F2 | F2a | F2b | F3 | ... etc. |
|----|-----|-----|----|----|-----|----|----|
| | | -------> | | | | | |
| | | Time | | | | | |

Then pixel by pixel for F1a and F1b:

$F1a(x,y)=\frac{2}{3}(F1(x,y))+\frac{1}{3}(F2(x,y))$ $F1b(x,y)=\frac{1}{3}(F1(x,y))+\frac{2}{3}(F2(x,y))$

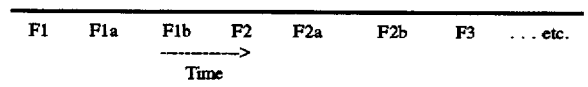

| For Y image: | $0 <= x <= 127$ | $0 <= y <= 111$ |
| For U and V image: | $0 <= x <= 31$ | $0 <= y <= 27$ |

In still frame mode, temporal interpolation is not performed.

2. SPATIAL INTERPOLATION

In both modes of operation it is necessary to interpolate missing pixel values in the I and Q images to make them the same dimension as the Y image. This is done by performing a linear interpolation (horizontally and vertically) to recreate the missing 3 pixels between each pair of existing pixels.

The recreated pixel set would look as follows where Ex are existing pixels, and Nx are new pixels.

| E1  | N1  | N2  | N3  | E2 | E3 | ..... |
|-----|-----|-----|-----|----|----|-------|
| N4  | N5  | N6  | N7  |    | Ea | ..... |
| N8  | N9  | N10 | N11 |    | Eb | ..... |
| N12 | N13 | N14 | N15 |    | Ec | ..... |
| Ei  |     |     |     | Ej | Ek | ..... |
| .   |     |     |     | .  | .  |       |
| .   |     |     |     | .  | .  |       |
| .   |     |     |     | .  | .  |       |

Each pixel N1 through N15 is a linear combination of the existing pixels E1, E2, Ei, and Ej. This process is carried out over the entire image.

At this point the images look like:

Still frame mode:

$Y=512\times448$ $I=512\times448$ $U=512\times448$

Video Phone mode:

$Y=128\times112$ $I=128\times112$ $U=128\times112$

At 30 frames per second.

A YIQ to RGB Conversion Block 296 converts Y, I, and Q images to R, G, and B images using well known equations which are the inverse of the equations used in the encoder to convert from RGB to YIQ.

The RGB video information is written out to a memory location where the Host CPU is responsible for reading the information and moving it to the display adapter of the Host computer. The information may be displayed on video display 298.

As used in the claims, the terms "connect," "connectable," or "connected to" are not necessarily limited to a direct connection. For example, Hierarchical Adaptive Multistage VQ Block 100 is connected to modem 220, although the connection is indirect.

As used herein, the term "video" is used loosely to refer to electronic representations of an image and is not limited to a particular standard (such as the NTSC or PAL standard) or to a particular medium (such as a raster scan cathode ray tube or a liquid crystal display). As used herein, the term "frame" is not limited to a particular format, such as interlaced frames that form an image. Rather, a frame may contain an entire image.

The L1 distance (or norm) is one example of a distance measurement. Other examples include the L2 distance (or norm), L3 distance (or norm), L-inf (as calculated in equation (7), above), and CUDist (as calculated in equation (8), above).

It is preferable to make constants programmable, but they may be hardwired or set in a read-only-memory variables.

As used herein, the term "a less than relationship" refers to "less than" or "less than or equal to." The term "a greater than relationship" refers to "greater than" or "greater than or equal to."

The term "system" could include a device or devices to operate with or without software or firmware.

The present invention may be embodied in specific forms other than those of the preceding description, which are to be considered only as illustrative and not restrictive. Accordingly, the scope of the invention is indicated by the following claims, including equivalents thereof, rather than by the specific embodiments described in the preceding description.

What is claimed is:

1. An hierarchical adaptive multistage vector quantizer to supply compressed video signals to a transmission line, said hierarchical adaptive multistage vector quantizer comprising:

means for receiving a vector I having a particular magnitude reflective of a portion of a video signal;

mean removal means for performing mean removal on vector I to provide a mean removed vector $I_M$;

an vector quantizer having "N" stages in which N equals 3 or more, the first stage performing vector quantization (VQ) and inverse vector quantization ($VQ^{-1}$) of the vector $I_M$ to obtain a residual vector $E_1$, the (N−1)th second stage performing VQ and inverse vector quantization ($VQ^{-1}$) of the residual vector $E_1$ to obtain a residual vector $E_{N-1}$ and the Nth stage performing vector quantization (VQ) and inverse vector quantization ($VQ^{-1}$) of the residual vector $EN_{N-1}$ to obtain residual vector $E_N$;

comparison means for comparing each vector($I_M$, $E_1$, $E_{N-1}$, ... $E_N$) to a threshold when each such vector is generated; and vector reduction means connected to be operative when residual vector $E_N$ is greater than said threshold for selecting a subsection of vector I for processing by the vector quantizer and for processing the comparison means until a residual vector ($r_s$), is equal to or less than said threshold; and means to generate and transmit to a transmission line an address representing said residual vector $r_s$ when said residual vector ($r_s$) is equal to or less than said threshold.

2. The quantizer of claim 1 wherein said threshold is adaptive to maintain a constant bit rate.

3. The quantizer of claim 2 wherein said threshold is adaptive as the vector I magnitude decreases and as the stages advance toward stage N.

4. The quantizer of claim 1 wherein said vector quantizer includes a motion compensator and a first codebook for use in vector quantization VQ on a current block and a second codebook is used for vector quantization VQ on residual vector which has been motion compensated by the motion compensator.

5. The quantizer of claim 1 in which the vector I is compared with the threshold.

6. An hierarchical adaptive multistage vector quantizer to supply compressed video signals to a transmission line, said hierarchical adaptive multistage vector quantizer comprising:

means for receiving a vector I having a particular magnitude reflective of a portion of a video signal;

mean removal means for performing mean removal on vector I to provide a mean removed vector $I_M$;

an vector quantizer having "N" stages in which N equals 3 or more with each of said N stages having its own vector codebook, the first stage performing vector quantization (VQ) and inverse vector quantization ($VQ^{-1}$) of the vector $I_M$ to obtain a residual vector $E_1$, the (N−1)th stage performing VQ and inverse vector quantization ($VQ^{-1}$) of the residual vector $E_1$ to obtain a residual vector $E_{N-1}$ and the Nth stage performing vector quantization (VQ) and inverse vector quantization ($VQ^{-1}$) of the residual vector $E_{N-1}$ to obtain residual vector $E_N$;

comparison means for comparing each vector($I_M$, $E_I$, $E_{N-1}$, ... $E_N$) to a threshold when each such vector is generated; and vector reduction means connected to be operative when residual vector $E_N$ is greater than said threshold for selecting a subsection of vector I for processing by the vector quantizer and for processing the comparison means until a residual vector ($r_s$) is equal to or less than said threshold; and selection means for selecting the first residual vector that is equal to or less than the threshold and for passing an address reflective of said residual vector to a transmission line.

* * * * *

UNITED STATES PATENT AND TRADEMARK OFFICE
CERTIFICATE OF CORRECTION

PATENT NO : 5,799,110
DATED : August 25, 1998
INVENTOR(S) : Israelsen et al.

It is certified that error appears in the above-identified patent and that said Letters Patent is hereby corrected as shown below:

Item [56]

Title Page  Under "U.S. PATENT DOCUMENTS" insert the following:

--4,560,977    12/1985    Murakami et al.
4,639,778      1/1987     Yamaguchi et al.
4,652,905      3/1987     Lippel
4,670,851      6/1987     Murakami et al.
4,710,812      12/1987    Murakami et al.
4,772,946      9/1988     Hammer
4,903,317      2/1990     Nishihara et al.
4,933,762      6/1990     Guichard et al.
4,943,855      7/1990     Bheda et al.--

Title Page  Under "OTHER PUBLICATIONS" insert the following:

--Linde, Y. et al., "An Algorithm for Vector Quantizer Design," IEEE Transactions on Communications, Vol. Com-28. No. 1 (Jan. 1980), pp. 84-95.

Juang, B.H. et al., "Multiple Stage Vector Quantization for Speech Coding," ICASSP Proceedings, Vol. 1:597-600, April 1982.

Makhoul, J., et al., "Vector Quantization in Speech Coding," IEEE Proceedings, Vol. 73, No. 11, November 1985, pp. 1551-88.

Gray, R.M., "Vector Quantization," IEEE ASSP Magazine, April 1984, pp. 4-29.

Elnahas, S.E., et al., "Progressive Coding and Transmission of Digital Diagnostic Pictures," IEEE Trans. on Medical Imaging, Vol. MI-5, No. 2, June 1986, pp. 73-83.

Elnahas, S.E., "Data Compression With Application to Digital Radiology," Ph.D. Dissertation, Washington University, Sever Institute of Technology, August 1984, pp. 56-68.--

| | | |
|---|---|---|
| Column 2 | line 65 | change "a" to --an--. |
| Column 4 | line 31 | after "horizontally," delete --which--. |
| Column 6 | line 9 | change "(32X32" to --(e.g. 32 X 32--. |
| Column 6 | table | change "52" to --82-- and change "85" (2nd occurrence) to --88--. |

UNITED STATES PATENT AND TRADEMARK OFFICE
CERTIFICATE OF CORRECTION

PATENT NO : 5,799,110
DATED : August 25, 1998
INVENTOR(S) : Israelsen et al.

It is certified that error appears in the above-identified patent and that said Letters Patent is hereby corrected as shown below:

| | | |
|---|---|---|
| Column 8 | line 10 | change "72" to --70--. |
| Column 9 | line 33 | after "do" delete --the--. |
| Column 9 | line 34 | change "VP" to --VQ--. |
| Column 9 | line 63 | change "($L1_{nomot}$" to --($L1_{mot}$--. |
| Column 10 | line 1 | change "UPDATE1 FLAG[i][j]" to --UPDATEFLAG[i][j]--. |
| Column 10 | line 12 | after "CONST)" add --)--. |
| Column 11 | line 24 | after "results" insert --to--. |
| Column 11 | line 39 | change ">" to --$\leq$--. |
| Column 14 | line 62 | change "Compensation Only Block 110" to --Motion Only Distance Compare Block 110--. |
| Column 15 | line 29 | change "Residue" to --Residual--. |
| Column 15 | line 64 | change "PRESENTFRA(0,0)." to --PRESENTFRAME(0,0).--. |
| Column 16 | line 1 | change "PRESENTFRAE(0,0)" to --PRESENTFRAME(0,0)--. |

UNITED STATES PATENT AND TRADEMARK OFFICE
CERTIFICATE OF CORRECTION

PATENT NO : 5,799,110
DATED : August 25, 1998
INVENTOR(S) : Israelsen et al.

It is certified that error appears in the above-identified patent and that said Letters Patent is hereby corrected as shown below:

|  | Column 17 | line 32 | after "FIFO" insert a comma. |
|---|---|---|---|
|  | Column 17 | line 33 | after "modem" insert a comma. |
|  | Column 18 | line 58 | insert --1. <u>Block Header</u>:--. |
|  | Column 20 | line 6 | insert --(-- before "H". |
|  | Column 20 | line 62 | change "SPATLAL" to --SPATIAL--. |
| Claim 1 | Column 22 | line 19 | change "an" to --a--. |
| Claim 1 | Column 22 | line 27 | change "$EN_{N-1}$" to --$E_{N-1}$--. |
| Claim 6 | Column 22 | line 57 | change "An" to --A--. |
| Claim 6 | Column 22 | line 66 | change "an" to --a--. |

Signed and Sealed this

Fifteenth Day of August, 2000

Attest:

Q. TODD DICKINSON

*Attesting Officer*　　　*Director of Patents and Trademarks*